(12) United States Patent
Chun

(10) Patent No.: US 8,709,951 B2
(45) Date of Patent: Apr. 29, 2014

(54) IMPLEMENTING STATE-OF-THE-ART GATE TRANSISTOR, SIDEWALL PROFILE/ANGLE CONTROL BY TUNING GATE ETCH PROCESS RECIPE PARAMETERS

(75) Inventor: Jay S. Chun, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1555 days.

(21) Appl. No.: 11/780,079

(22) Filed: Jul. 19, 2007

(65) Prior Publication Data
US 2009/0023293 A1  Jan. 22, 2009

(51) Int. Cl.
*H01L 21/302* (2006.01)
*H01L 21/461* (2006.01)

(52) U.S. Cl.
USPC .............................. 438/707; 438/406; 438/409

(58) Field of Classification Search
USPC .................. 438/707, 706, 709; 702/85; 257/E21.483
See application file for complete search history.

(56) References Cited

U.S. PATENT DOCUMENTS

| 2005/0029228 A1* | 2/2005 | Nozawa et al. | 216/60 |
| 2005/0202672 A1* | 9/2005 | Divakaruni et al. | 438/652 |
| 2005/0205862 A1* | 9/2005 | Koemtzopoulos et al. | 257/40 |
| 2006/0205223 A1* | 9/2006 | Smayling | 438/725 |
| 2007/0037101 A1* | 2/2007 | Morioka | 430/313 |
| 2007/0281491 A1* | 12/2007 | Kamp | 438/717 |

FOREIGN PATENT DOCUMENTS

CN  1851872  * 12/2005  ............ H01L 21/306

OTHER PUBLICATIONS

S. Wolf and R.N. Tauber, (Silicon Processing for the VLSI Era, vol. 1—Process Technology, Lattice Press, 1986) (pp. 546-547).*
Translation of abstract of CN1851872 publication (2 pages).*

* cited by examiner

*Primary Examiner* — Duy Deo
*Assistant Examiner* — Mahmoud Dahimene
(74) *Attorney, Agent, or Firm* — Alan A. R. Cooper; W. James Brady, III; Frederick J. Telecky, Jr.

(57) ABSTRACT

In accordance with the invention, there are methods of controlling the sidewall angle of a polysilicon gate from batch to batch while maintaining current bottom critical dimension control performance. The method can include generating a correlation between a sidewall angle of a gate and RF bias power and etch time of one or more etch steps during the formation of the gate, developing a statistical model for the sidewall angle as a function of one or more of polysilicon density, polythickness, and etcher, and predicting a sidewall angle using the statistical model for a given polydensity, a given polythickness, and a given etcher. The method can also include comparing the predicted sidewall angle with a target sidewall angle and determining an optimized RF bias power and optimized etch time of one or more etch steps during the formation of the gate using the correlation to match the target sidewall angle.

10 Claims, 4 Drawing Sheets

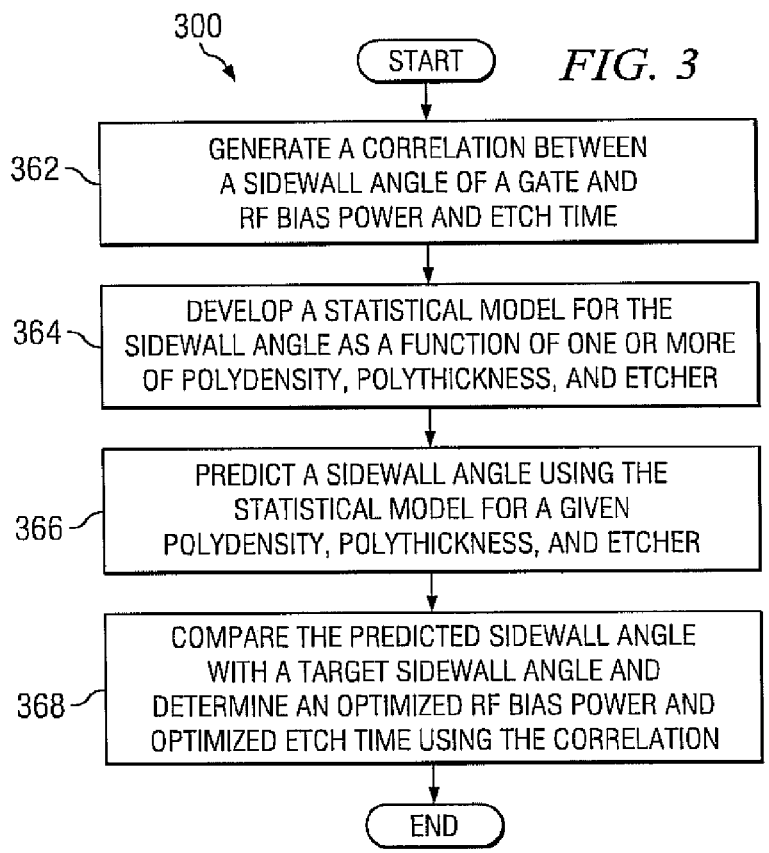
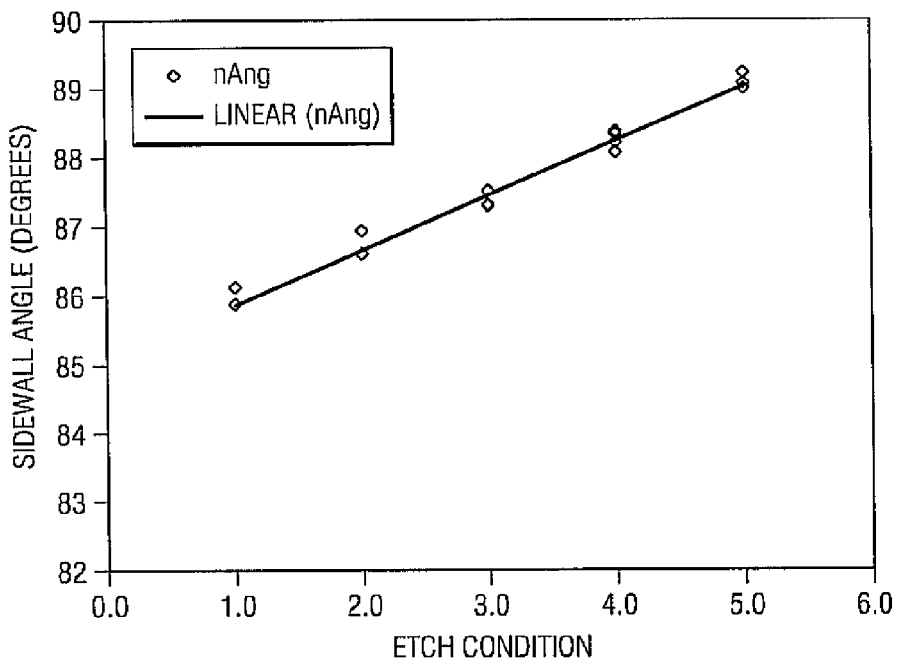

IMPLEMENTING STATE-OF-THE-ART GATE TRANSISTOR, SIDEWALL PROFILE/ANGLE CONTROL BY TUNING GATE ETCH PROCESS RECIPE PARAMETERS

DESCRIPTION OF THE INVENTION

1. Field of the Invention

The subject matter of this invention relates to methods of fabricating semiconductor devices. More particularly, the subject matter of this invention relates to methods of controlling gate transistor sidewall profile/angle variation from batch to batch while maintaining current bottom critical dimension (CD) control performance.

2. Background of the Invention

With the shrinking of the design rules and decreasing process windows (i.e. margins of error in processing), the variation in critical dimension is becoming increasingly important. The critical dimension (CD) refers to dimensions of the smallest geometrical features, such as width of interconnect line, contacts, trenches, etc., which can be formed during semiconductor device/circuit manufacturing using given technology. Currently, gate bottom CD is controlled while sidewall angle is only monitored. As a result of the sidewall angle not being controlled, there is a significant variation in the sidewall angle from run to run. Sidewall angle variation in turn impacts parametric $I_{drive}$ currents and yield.

Thus, there is a need to overcome these and other problems of the prior art and to provide methods of fabricating gates having reduced sidewall angle variation from batch to batch while maintaining current bottom CD control performance.

SUMMARY OF THE INVENTION

In accordance with the invention, there is a method of forming polysilicon gates having controlled sidewall angle variation from batch to batch while maintaining current bottom critical dimension (CD) control performance. The method can include selecting one of a plurality of process recipes based on a polydensity, a polythickness, and an etcher, wherein each of the plurality of process recipes comprises an optimized first, second, third, fourth, and fifth radio frequency (RF) power, and an optimized fourth etch time as compared to baseline values of the first, second, third, fourth, and fifth RF power, and the fourth etch time. The method can also include removing an unmasked bottom anti-reflective coat (BARC) layer over the polysilicon layer using the optimized first RF power and trimming a masked BARC layer and a photoresist layer over the masked BARC layer using the optimized second RF power. The method can further include breaking through a native oxide layer over an unmasked polysilicon layer using the optimized third RF power, removing a substantial amount of the unmasked polysilicon layer by using the optimized fourth RF power for the optimized fourth etch time, and removing majority of the remaining unmasked polysilicon layer not removed by the steps above using optical emission and the optimized fifth RF power.

According to another embodiment of the present teachings, there is a method of reducing sidewall angle variation of a polysilicon gate from batch to batch while maintaining current bottom critical dimension (CD) control performance. The method can include generating a correlation between a sidewall angle of a gate and RF bias power and etch time of one or more etch steps during the formation of the gate and developing a statistical model for the sidewall angle as a function of one or more of polysilicon density, polythickness, and etcher. The method can also include predicting a sidewall angle using the statistical model for a given polydensity, a given polythickness, and a given etcher. The method can further include comparing the predicted sidewall angle with a target sidewall angle and determining an optimized RF bias power and optimized etch time of one or more etch steps during the formation of the gate using the correlation between the sidewall angle of the gate and the RF bias power and the etch time of the one or more etch steps during the formation of the gate to match the target sidewall angle.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIG. 3 is a flow chart of an exemplary method of reducing sidewall angle variation of a polysilicon gate from batch to batch, according to various embodiments of the present teachings.

FIGS. 4A-4B are graphs plotting sidewall angle as a function of etch conditions according to various embodiments of the present teachings.

DESCRIPTION OF THE EMBODIMENTS

Reference will now be made in detail to the exemplary embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1,−2, −3, −10, −20, −30, etc.

Figure 1A:
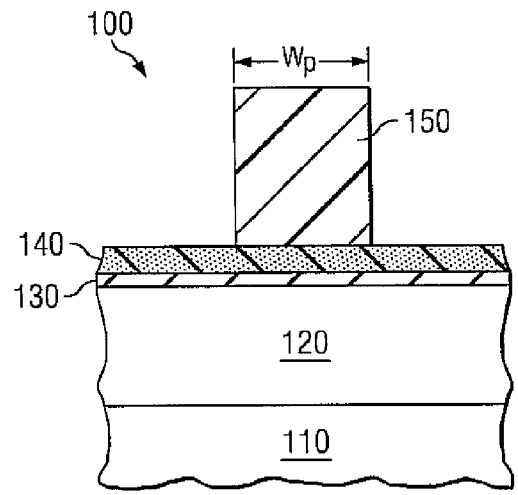
FIGS. 1A-1G are schematic illustrations of an exemplary method of forming polysilicon gates having reduced sidewall angle variation from batch to batch in accordance with various embodiments of the present teachings.

FIGS. 1A-1G depict a schematic illustration of exemplary steps involved in forming a polysilicon gate 126. FIGS. 1A-1G depict a film stack 100 including a layer of polysilicon 120 over a substrate 110. In various embodiments, the film stack 100 can include a layer of gate dielectric (not shown) over the substrate and the polysilicon layer 120 over the layer of gate dielectric (not shown). In some embodiments, the polysilicon layer 120 can include undoped polycrystalline silicon. In other embodiments, the polysilicon layer can include polycrystalline silicon, doped with dopants known to one of ordinary skill in the art. The polysilicon layer 120 can be deposited by any suitable method, such as, for example, low pressure chemical vapor deposition and e-beam deposition. In some embodiments, the polysilicon layer 120 can be deposited by pyrolyzing (decomposing thermally) silane, $SiH_4$, inside a low-pressure reactor (not shown) at a temperature of about 580° C. to about 650° C. The thickness of the polysilicon layer 120 can depend on the position of the substrate 110 in the low-pressure reactor besides other factors such as processing temperature, pressure, etc. Hence, the term "polythickness" will be used herein to indicate thickness corresponding to the position of the substrate 110 in the low-pressure reactor during polysilicon deposition. The film stack 100 can also include a thin layer of native oxide 130 over the polysilicon layer 120 and a layer of bottom antireflective coating (BARC) 140 over the native oxide layer 130 to reduce reflections during photolithography. In various embodiments, the BARC layer 140 can include one or more of an organic BARC layer, an inorganic BARC layer, and a hybrid organic-inorganic BARC layer. In general, organic BARC materials can have a thickness from about 600 Å to about 1200 Å, whereas inorganic BARC can have a thickness from about 300 Å to about 500 Å. The film stack 100 can further include a patterned photoresist layer 150 over the BARC layer 140, to form regions of masked BARC layer 140 and unmasked BARC layer 140, as shown in FIG. 1A. In various embodiments, the total height of the BARC layer 140 and the photoresist layer 150 can be optimized for lithographic purposes, for example, to minimize the standing wave effects and to ensure the pattern subsequently formed will survive the polysilicon layer 120 etch. The material of the photoresist layer 150 can be UV or deep UV sensitive. Thus, the film stack 100, as shown in FIG. 1A includes photoresist portions 150 at the locations where masked BARC 140 and polysilicon layer 120 are to be protected from the ensuing etches. As shown in FIG. 1A, the remaining photoresist layer 150 is a feature with a width, or critical dimension (CD) value, $w_p$. In general, photoresist feature CD value $w_p$ is significantly larger than the CD value $w_{ps}$ of the polysilicon gate 126 (see FIG. 1G). As known in the art, feature CD value $w_p$ can be less than the light wavelength, through the use of phase shift masking and other techniques, but is still substantially larger than the eventual CD value $w_{ps}$ of the polysilicon gate 126. As used herein, the term "polydensity" refers to the feature density of the photoresist layer 150. In other words, polydensity is the area occupied by the photoresist layer 150 as shown in FIG. 1A divided by the total area of the wafer or the polysilicon silicon layer 120 before etching, as shown in FIG. 1A, times 100. For example, if 20% of the total area of the substrate 110 is covered by the photoresist layer 150, then the polydensity is 20%.

Figure 1B:
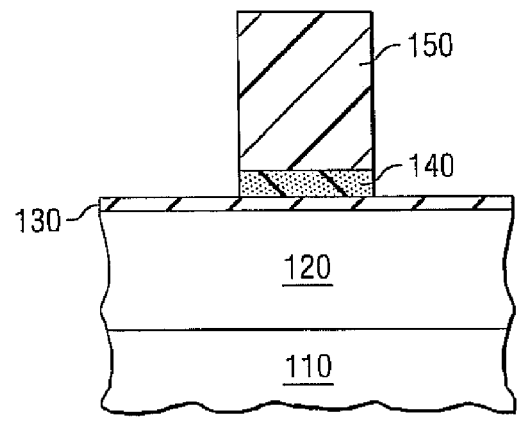

The first etch step in forming a gate 126 can include removing the unmasked BARC layer 140 over the polysilicon layer 120, as shown in FIG. 1B. In various embodiments, an anisotropic vertical plasma etch can be used to remove the unmasked BARC layer 140. In some embodiments, the plasma etch of the BARC layer 140 can be carried out using one or more of hydrogen bromide (HBr) and oxygen ($O_2$) as etchant gases at a low pressure and at a first RF bias power. An exemplary etch recipe for removing BARC layer is given in Table 1 under the heading "BARC Main etch". This etch can be carried out until the unmasked BARC layer 140 has been removed. The duration of this etch can be controlled by any suitable endpoint detection technique, such as, for example, optical emission monitoring, laser interferometry, plasma gas composition monitoring, or wafer impedance monitoring. The resulting structure is shown in FIG. 1B. In various embodiments, the unmasked BARC layer 140 etch can also remove a portion of photoresist layer 150 from the top, due to the presence of the oxygen etch species and the impact of energetic ions present in the plasma.

Figure 1C:
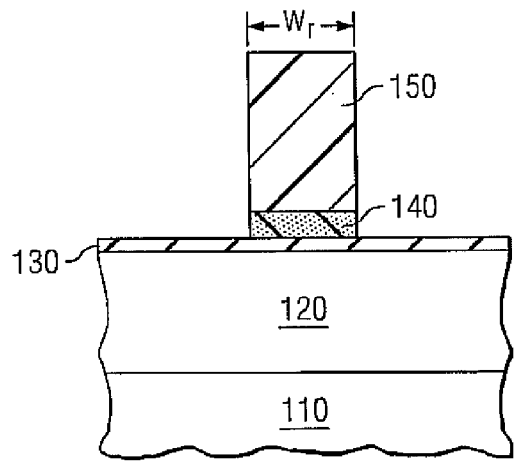
Figure 1D:
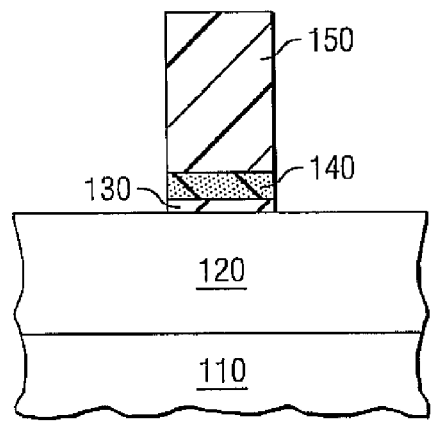
Figure 1E:
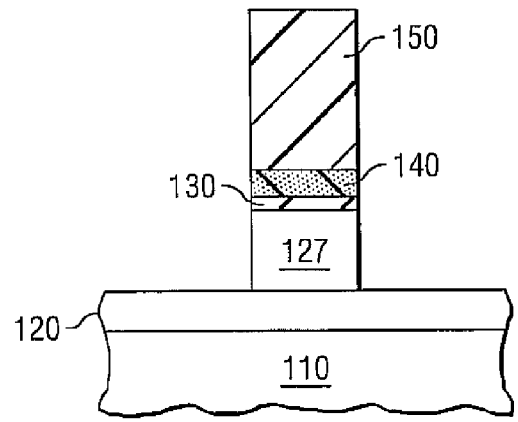
Figure 1F:
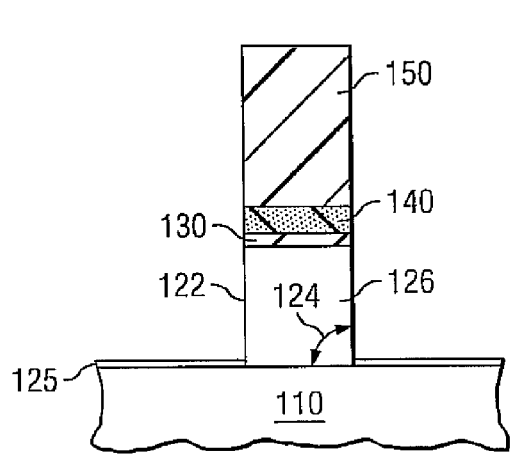
Figure 1G:
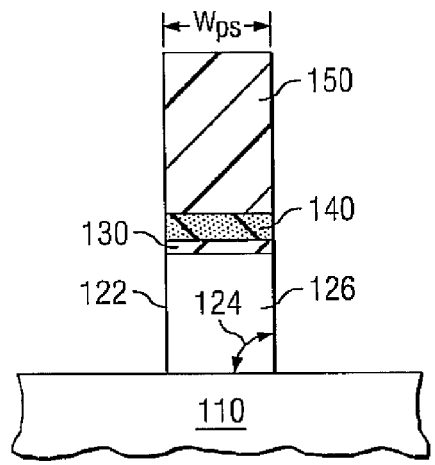

The formation of the polysilicon gate 126 can further include trimming the masked BARC layer 140 and the photoresist layer 150 by an isotropic horizontal plasma etch to decrease the feature CD $w_p$, as shown in FIG. 1C. The same or slightly different conditions and chemistry as used to remove the unmasked BARC layer 140 can be used. Table 1 provides an exemplary etch recipe for trimming the masked BARC layer 140 and the photoresist layer 150, under the heading "BARC over Overetch". An over overetch by time or as a percentage of the main etch time of the BARC layer 140 can be used to achieve the desired reduction in linewidth creating a reduced width pattern $w_r$, as shown in FIG. 1C. In various embodiments, the selectivity of the etch between the photoresist 150 and BARC 140 can be approximately one-to-one. The maximum linewidth reduction is limited at the point where there is not enough photoresist 150 left to survive the subsequent polysilicon etch. The $HBr/O_2$ etch is very selective to both polysilicon and the native oxide. Thus, thin native oxide layer 130 over the polysilicon layer 120 can protect the polysilicon layer 120 from the $HBr/O_2$ etch. FIG. 1D shows breaking through the native oxide layer 130 over the unmasked polysilicon layer 120. In some embodiments, the native oxide layer 130 can be etched using carbon tetrafluoride ($CF_4$) as an etchant gas at an extremely low pressure and at a third RF bias power. An exemplary etch recipe for breaking through the native oxide layer 130 is given in Table 1 under the heading "Breakthrough". The formation of the polysilicon gate 126 can further include the main etch step including the removal of a substantial amount of the unmasked polysilicon layer 120 as shown in FIG. 1E. In some embodiments, about two-thirds of the unmasked polysilicon layer 120 can be removed in the main etch step, as shown by the etched polysilicon layer 127 in FIG. 1E. In various embodiments, the substantial amount of the unmasked polysilicon layer 120 can be etched using one or more of hydrogen bromide (HBr), carbon tetrafluoride ($CF_4$), chlorine ($Cl_2$), helium (He), and oxygen ($O_2$) as etchant gases, at an extremely low pressure and at a fourth RF bias power. The etching can be carried out for the fourth etch time. An exemplary etch recipe for the main etch step is given in the Table 1, under the heading "Main etch". The main etch can be followed by a poly endpoint step as shown in FIG. 1F, where etching can be done to an endpoint using one or more of hydrogen bromide, chlorine, helium, and oxygen as etchant gases and at a fifth RF bias power. An exemplary etch recipe for the poly endpoint step is given in Table 1, under the heading "Endpoint". In some embodiments, about one-tenth of the polysilicon layer 120 can remain after the poly endpoint step, as shown by the polysilicon layer 125 in FIG. 1F. FIG. 1G shows the removal of the remaining unmasked polysilicon layer 125 not removed by the above step by selective overetch using one or more of hydrogen bromide, helium, and oxygen as etchant gases. The etching can be done at a low pressure and at a sixth RF bias power. In some embodiments all of the unmasked polysilicon layer 120, 125 can be removed after the poly overetch step, as shown in FIG. 1G, thereby resulting in the formation of the polysilicon gate 126 having sidewalls 122 and the sidewall angle 124. It should be noted that any other suitable polysilicon etch process can be used to etch the polysilicon layer 120. However, an advantage of the disclosed etch process is that the etch chemistries used for the etching of the BARC layer 140 and those for the etching of the polysilicon layer 120 do not interfere with each other and therefore both etch processes can be performed in the same chamber without breaking vacuum. This can allow for reduced cycle time and a cleaner process.

TABLE 1

Baseline Etch Condition # 3

|  |  | BARC Main etch | BARC Over etch | Poly etch | | |
|---|---|---|---|---|---|---|
|  |  |  |  | Breakthrough | Main etch | Endpoint |
| Gases | HBr | 87 cc | 87 cc |  | 90 cc | 160 cc |
|  | O₂ | 32 cc | 32 cc |  |  |  |
|  | CF₄ |  |  | 50 cc | 20 cc |  |
|  | Cl₂ |  |  |  | 55 cc | 20 cc |
|  | He—O₂ |  |  |  | 15 cc | 4 cc |
| Pressure |  | 8 mTorr | 8 mTorr | 4 mTorr | 4 mTorr | 20 mTorr |
| RF bias power |  | 100 W | 100 W | 40 W | 80 W | 30 W |
| Source power |  | 310 W | 310 W | 500 W | 800 W | 1000 W |
| Etch time |  | End point | Timed | 15 second | 22 second | 40 second |

In various embodiments, the etcher can be any polysilicon etcher with a secondary RF source to the cathode. An exemplary etcher can be a decoupled plasma (DPS) poly etcher (Applied Materials, Inc., Santa Clara, Calif.). Various etching steps can be carried out using other mixtures of gases such as, oxygen, chlorine, carbon tetrachloride, sulfur hexafluoride, silicon tetrachloride, and other halocarbons to meet the rate, selectivity, and anisotropy requirement of the particular etch step in the formation of the polysilicon gate, and the material to be etched.

Figure 2:
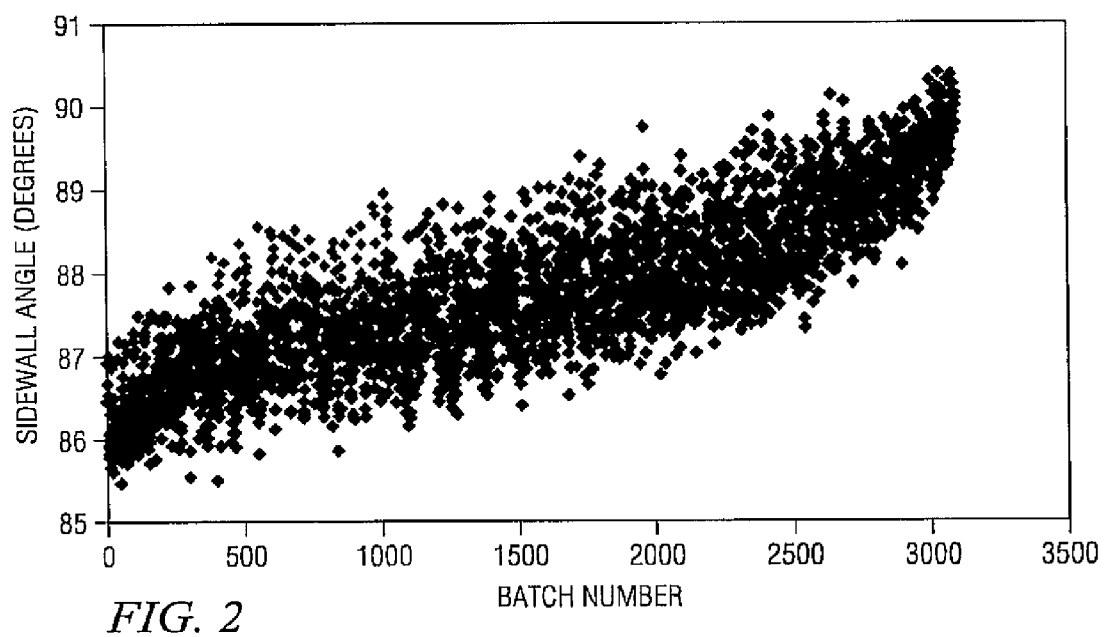
FIG. 2 shows an exemplary sidewall angle distribution from batch to batch over a period of one year.

It is known that the sidewall angle 124 of the polysilicon gate 126 can vary from batch to batch. FIG. 2 shows an exemplary sidewall angle distribution from batch to batch over a period of one year. Sidewall angle variation in turn impacts parametric $I_{drive}$ currents and yield. It has now been determined that among all the etching process parameters listed in Table 1, the parameters that impact the sidewall angle the most are the first, second, third, fourth, and fifth RF bias power and the fourth etch time.

Figure 4B:
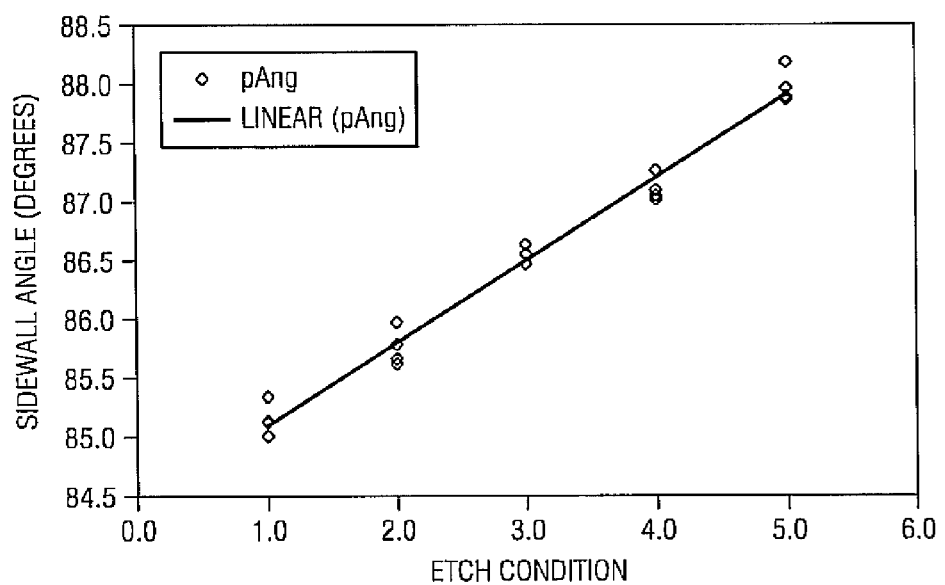

According to various embodiments, there is a method (300) of reducing sidewall angle variation of a polysilicon gate from batch to batch as shown in FIG. 3. The method (300) can include generating a correlation between a sidewall angle of a gate and RF bias power and etch time of one or more etch steps during the formation of the gate, as in step 362. FIGS. 4A and 4B show exemplary correlations between the sidewall angle and the etch conditions for an NMOS and a PMOS gate respectively, where only the RF bias power and poly main etch time are the variables. The various etch condition used in FIGS. 4A and 4B are listed in Table 2, wherein the base line RF bias power and baseline main etch time are those given in Table 1.

TABLE 2

| Etch condition | RF bias power of all the five steps listed in Table 1 | Poly main etch time |
|---|---|---|
| 1 | 110% | 80% |
| 2 | 107% | 90% |
| 3 | Baseline RF bias power | Baseline main etch time |
| 4 | 93% | 110% |
| 5 | 90% | 120% | wherein the % RF bias power and the % poly main etch time of conditions 1, 2, 4, and 5 are % value of the baseline RF bias power (80 W) and % value of the baseline main etch time (22 seconds) respectively.

For an NMOS gate, a curve fitting of the sidewall angle versus the etch conditions gave:

$$f(x)=85.066 +0.7974x \tag{1}$$

wherein x corresponds to the etch condition, as listed in Table 2. For a PMOS gate, a curve fitting of the sidewall angle versus the etch conditions gave:

$$f(x)=84.377 +0.7097x \tag{2}$$

wherein x corresponds to the etch condition, as listed in Table 2. The method of reducing sidewall angle variation of a polysilicon gate from batch to batch can also include developing a statistical model for the sidewall angle as a function of one or more of polydensity, polythickness, and the etcher, as in step 364 of FIG. 3. In various embodiments, empirical data can be used to develop a statistical model, such as, for example:

$$\text{Predicted angle}=83.4775+\text{etcher}+0.0036*\text{polythickness}+0.1423 *\text{polydensity} \tag{3}$$

wherein the etcher is a constant offset, unique for each poly etcher. Six different etchers were used to generate the data to develop the above statistical model. However, only four of the six etchers exhibited offset: −0.2436, +0.6252, +0.3267, and −0.7167. The polythickness in the above equation corresponds to the position of the substrate 110 in the low pressure reactor during polysilicon deposition and can have values ranging from about 2 to about 107 and polydensity refers to the feature density of the photoresist layer 150 and can have values in the range from about 20% to about 50%. The statistical model, as shown in equation 3 was developed using JMP statistical software (SAS Institute, Cary, NC, USA), but one of ordinary skill in the art may use any other suitable software. One of ordinary skill in the art would know that the statistical model as shown in equation 3 will be different for a different set of etchers and also if different etching conditions are used.

The method of reducing sidewall angle variation of a polysilicon gate from batch to batch can further include predicting a sidewall angle using the statistical model for a given polydensity, a given polythickness, and a given etcher, as in step 366 of FIG. 3. In various embodiments, equation 3 can be used to predict a sidewall angle. The method can further include comparing the predicted sidewall angle with a target sidewall angle and determining an optimized RF bias power and optimized etch time of one or more etch steps during the formation of the gate using the correlation between the sidewall angle of the gate and the RF bias power and the etch time of the one or more etch steps during the formation of the gate to match the target sidewall angle, as in step 368 of FIG. 3. For example, for an NMOS gate, equation 1 can be used to determine optimized etch condition x, using predicted angle as f(x).

According to various embodiments, there is a method of forming polysilicon gates 126 having controlled sidewall angle 124 variation from batch to batch as shown in FIGS. 1A-1G. The method can include selecting one of a plurality of process recipes based on a polydensity, a polythickness, and an etcher, wherein each of the plurality of process recipes includes an optimized first, second, third, fourth, and fifth radio frequency (RF) power, and an optimized fourth etch time as compared to the baseline values of the first, second, third, fourth, and fifth RF power, and the fourth etch time. The method can also include removing an unmasked bottom anti-reflective coat (BARC) layer 140 over the polysilicon layer 120 using the optimized first RF power, as shown in FIG. 1B and trimming a masked bottom anti-reflective coat (BARC) layer 140 and a photoresist layer 150 over the masked BARC layer 140 using the optimized second RF power, as shown in FIG. 1C. The method can further include breaking through a native oxide layer 130 over an unmasked polysilicon layer 120 using the optimized third RF power, as shown in FIG. 1D. The method can also include removing a substantial amount of the unmasked polysilicon layer 120 by using the optimized fourth RF power for the optimized fourth etch time, as shown in FIG. 1E and removing majority of the remaining unmasked polysilicon layer 120 not removed by the steps above using optical emission and the optimized fifth RF power, as shown in FIG. 1F. Finally, the remaining unmasked polysilicon layer 125 can be removed by an overetch step at the baseline RF bias power, as shown in FIG. 1G, thereby resulting in the formation of the polysilicon gate 126 having sidewalls 122 and the sidewall angle 124.

Figure 5:
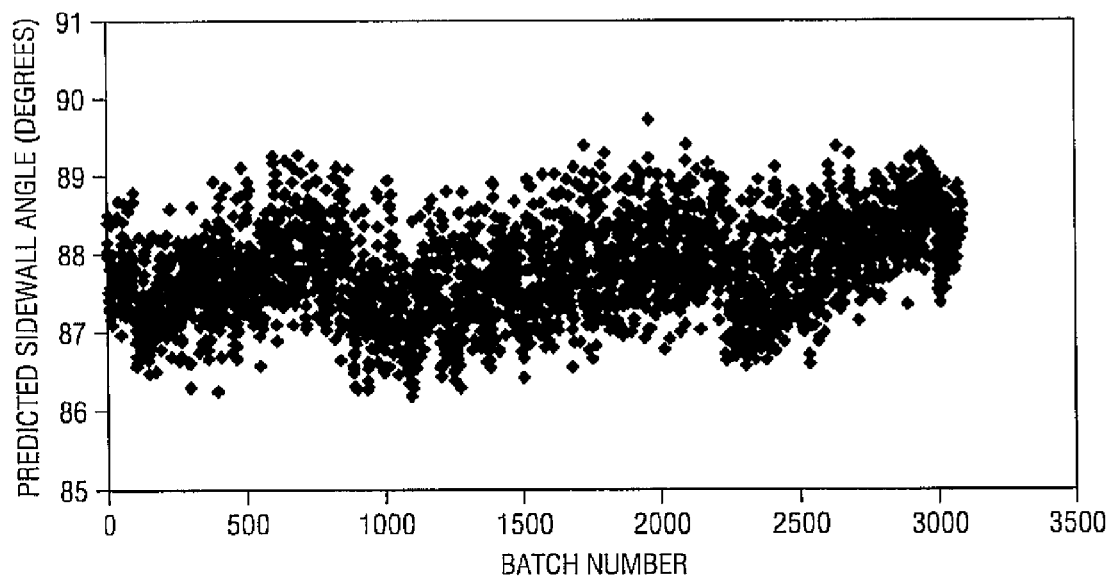
FIG. 5 shows an exemplary predicted sidewall angle distribution from batch to batch for a period of one year using a statistical model and optimized process parameters according to various embodiments of the present teachings.

FIG. 5 shows an exemplary predicted sidewall angle distribution from batch to batch for a period of one year using the statistical model as given in equation 3 and the optimized process parameters according to various embodiments of the present teachings. FIG. 5 shows that using the statistical model as given in equation 3 and using the optimized process parameters, one can change the distribution of the average sidewall angle from 87.8°±0.978°, as shown in FIG. 2 to 87.8°±0.590°, as shown in FIG. 5. One of ordinary skill in the art will understand that the reduction in the sidewall angle batch to batch variability of the polysilicon gate from approximately 1° to less than approximately 0.6° is only exemplary and one may observe smaller or larger change.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a semiconductor device, comprising:
   providing a patterned photoresist layer to establish masked and unmasked regions over a gate stack including:
      a) a polysilicon layer over a substrate,
      b) an oxide layer over the polysilicon layer, and
      c) a BARC (bottom anti-reflective coat) layer over the oxide layer; the masked region defining a pattern line width dimension $w_p$;
   removing the BARC layer from the unmasked region using a first plasma etch at a first etch RF bias power;
   trimming the patterned photoresist layer and the BARC layer to modify the masked and unmasked regions using a second plasma etch at a second etch RF bias power; the modified masked region defining a reduced pattern line width dimension $w_r < w_p$;
   removing the oxide layer from the modified unmasked region using a third plasma etch at a third etch RF bias power;
   removing an amount of the polysilicon layer from the modified unmasked region using a fourth plasma etch at a fourth etch RF bias power and for a fourth etch time; and
   after removing the amount, removing a majority of any remaining part of the polysilicon layer from the modified unmasked region using a fifth plasma etch at a fifth etch RF bias power, resulting in the formation of a polysilicon gate having sidewalls and a targeted sidewall angle;
   wherein the first, second, third, fourth and fifth etch RF bias powers are set as respective first, second, third, fourth and fifth etch baseline RF bias powers of a given process recipe multiplied by a first adjustment percentage value equally applied to all of the first, second, third, fourth and fifth baseline RF bias powers, wherein the first adjustment percentage value is not equal to 100% or to 0%;
   and the fourth etch time is set as a baseline fourth etch time of the given process recipe multiplied by a second adjustment percentage value, with the first and second adjustment percentage values being determined from a pre-established correlation of variation in sidewall angle with variations in the first, second, third, fourth and fifth etch RF bias powers and the fourth etch time.

2. The method of claim 1, wherein forming the polysilicon layer defines a polythickness parameter by a position of the substrate, wherein the polythickness parameter is the thickness of the polysilicon layer, within a reactor chamber during forming of the polysilicon layer;

forming the patterned photoresist layer defines a polydensity parameter by a feature density of the patterned photoresist layer; removing the amount is done in an etcher defining an etcher parameter; and the first and second adjustment percentage values are determined using the pre-established correlation to compensate for a difference between the targeted sidewall angle and a sidewall angle predicted from a statistical model of variation in sidewall angle with variations in the polythickness, polydensity and etcher parameters.

3. The method of claim 2, wherein the first, second, third, fourth and fifth etches are performed in a same etcher chamber without breaking vacuum.

4. The method of claim 3, wherein the etcher has a secondary RF source to a cathode.

5. The method of claim 4, wherein the first, second, third, fourth and fifth etches are performed in a same etcher chamber; the first plasma etch uses one or more of hydrogen bromide and oxygen as etchant gases for a time determined by endpoint detection; the second plasma etch comprises an isotropic etch using the first plasma etch chemistry for a set time or for a percentage of the time of the first plasma etch; the third plasma etch uses carbon tetrafluoride as an etchant gas to break through a native oxide; the fourth plasma etch uses one or more of hydrogen bromide, carbon tetrafluoride, chlorine, helium, and oxygen as etchant gases for the fourth etch time; and the fifth plasma etch uses one or more of hydrogen bromide, chlorine, helium, and oxygen as etchant gases for a time determined by endpoint detection.

6. The method of claim 2, wherein the step of removing the BARC layer from the unmasked region comprises using one or more of hydrogen bromide and oxygen as etchant gases.

7. The method of claim 2, wherein the step of removing the oxide layer comprises breaking through a native oxide layer using carbon tetrafluoride as an etchant gas.

8. The method of claim 2, wherein the step of removing an amount of the polysilicon layer comprises using one or more of hydrogen bromide, carbon tetrafluoride, chlorine, helium, and oxygen as etchant gases.

9. The method of claim 2, wherein the step of removing a majority of any remaining part of the polysilicon layer comprises using one or more of hydrogen bromide, chlorine, helium, and oxygen as etchant gases.

10. The method of claim 1, wherein the first RF bias power is a is a BAR main etch RF power, the second RF bias power is a BARC over etch RF power, the third RF bias power is a poly etch breakthrough RF power, the fourth RF bias power is a poly etch main etch RF power, and the fifth RF bias power is a poly etch endpoint RF power.

* * * * *